Figure 1:
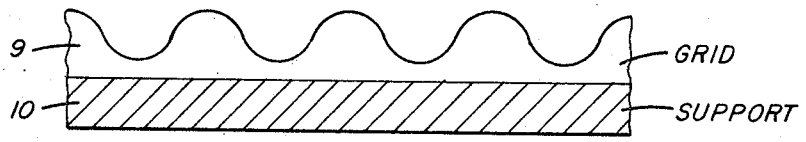
Figure 2:
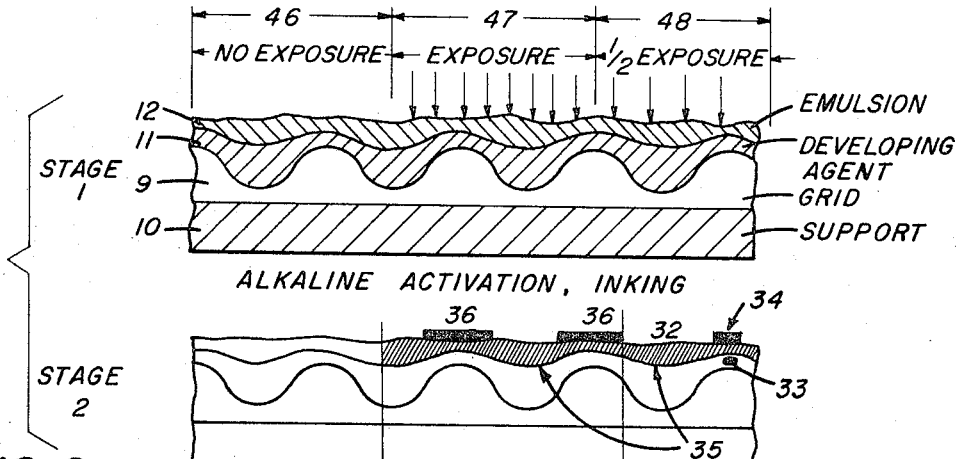
Figure 3:
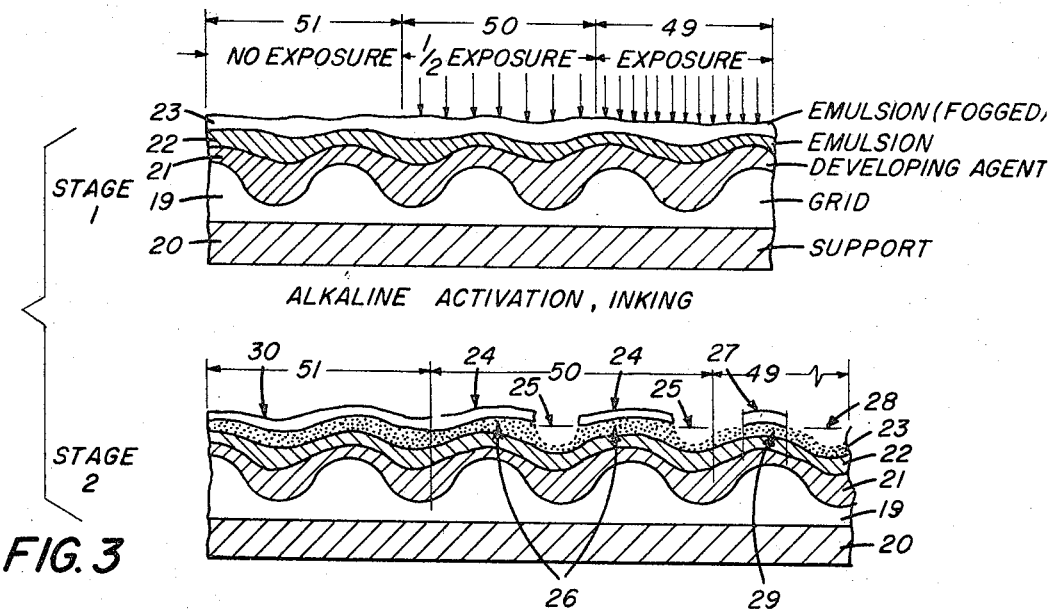

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED SEPTEMBER 8, 1970

878 O.G. 240

T878,009

NOVEL PRESCREENED PHOTOSENSITIVE LITHOGRAPHIC PRINTING PLATES

Joe E. South, c/o Eastman Kodak Co., Kodak Park Works, Rochester, N.Y. 14650

Filed Feb. 24, 1970, Ser. No. 13,493
Int. Cl. G03t 7/02
U.S. Cl. 96—33
1 Sheet Drawing. 17 Pages Specification

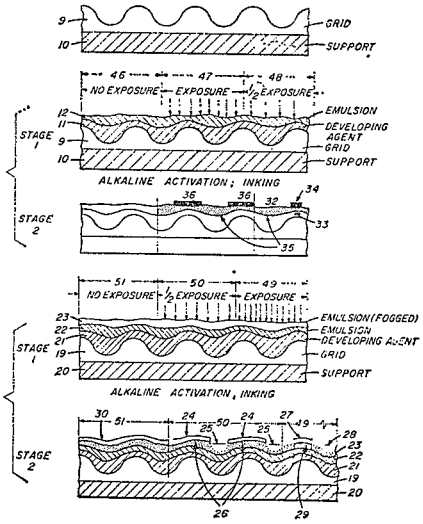

A light sensitive photographic element capable of use as a lithographic printing plate, comprises a support having thereon an embossed surface comprising a myriad of elevations and cavities, the upper surface of the elevations lying in the same plane with respect to each other. Over the embossed surface is coated a gelatin layer containing a sufficient amount of a polyhydroxybenzene silver halide developing agent to develop a latent image in a silver halide light sensitive layer above it. The developing agent can be pyrogallol and halogen substituted, phenyl substituted, or alkyl substituted polyhydroxybenzene developing agents containing from 2 to 6 carbon atoms, the oxidation products of which render gelatin oleophilic. Over the gelatin layer there can be gelatino-silver halide emulsion layer uniformly hardened with a hardener such that the gelatin has a hardness equivalent to that of a gelatin layer hardener with about 2 to about 15 grams of dry formaldehyde per pound of gelatin, with the gelatin layer and the gelatino-silver halide emulsion layer together together and separately being of lesser thickness in the regions of the elevations of the embossed surface than in the regions of the cavities thereof.

NOVEL PRESCREENED PHOTOSENSITIVE LITHOGRAPHIC PRINTING PLATES

Filed Feb. 24, 1970

JOE E. SOUTH
INVENTOR.

BY Henry E. Byers

ATTORNEY